United States Patent
Liao et al.

(10) Patent No.: US 11,353,712 B2
(45) Date of Patent: Jun. 7, 2022

(54) VIRTUAL REALITY FLUID FLOW BODY SENSING DEVICE

(71) Applicant: National Taipei University of Technology, Taipei (TW)

(72) Inventors: Yi-Ya Liao, Kaohsiung (TW); Ju Chun Ko, New Taipei (TW)

(73) Assignee: National Taipei University of Technology, Taipei (TW)

( * ) Notice: Subject to any disclaimer, the term of this patent is extended or adjusted under 35 U.S.C. 154(b) by 171 days.

(21) Appl. No.: 16/921,051

(22) Filed: Jul. 6, 2020

(65) Prior Publication Data

US 2022/0004010 A1   Jan. 6, 2022

(51) Int. Cl.
*G02B 27/01*   (2006.01)
*H05K 7/20*   (2006.01)

(52) U.S. Cl.
CPC ..... *G02B 27/0176* (2013.01); *H05K 7/20272* (2013.01); *H05K 7/20281* (2013.01)

(58) Field of Classification Search
CPC .. G02B 27/0176; G02B 27/01; G02B 27/017; H05K 7/20272; H05K 7/20281; H05K 7/2028
See application file for complete search history.

(56) References Cited

U.S. PATENT DOCUMENTS

| | | | |
|---|---|---|---|
| 9,740,023 B1* | 8/2017 | Ash | G02C 5/22 |
| 2017/0112667 A1* | 4/2017 | Fateh | G02B 27/0176 |
| 2017/0274279 A1* | 9/2017 | Fateh | B05B 7/0081 |
| 2020/0273777 A1* | 8/2020 | Jain | H01L 21/565 |
| 2022/0007538 A1* | 1/2022 | Mou | G06F 1/163 |

\* cited by examiner

*Primary Examiner* — Roy P Rabindranath
(74) *Attorney, Agent, or Firm* — Alan D. Kamrath; Karin L. Williams; Mayer & Williams PC

(57) ABSTRACT

Provided is a virtual reality fluid body sensing device which includes: a body sensing eye mask made according to the contour of a face and having an opening for a wearer's eyes to see through, and the body sensing eye mask is in conjunction with a virtual reality goggle. There is also a fluid channel in the body sensing eye mask. A fluid control system, connected to the body sensing eye mask, can supply a fluid to the fluid channel of the body sensing eye mask and adjust the fluid temperature, flow rate and flow speed of the fluid injected into the body sensing eye mask. By combining the body sensing eye mask with the virtual reality goggle and supplying cold and hot fluids to the body sensing eye mask through the fluid control system, a virtual reality environment can be achieved for the wearer.

9 Claims, 6 Drawing Sheets

VIRTUAL REALITY FLUID FLOW BODY SENSING DEVICE

BACKGROUND OF THE INVENTION

1. Field of the Invention

The present invention relates to the technical field of virtual reality, in particular to a virtual reality fluid flow sensing device applied to virtual reality goggles.

2. Description of the Related Art

Virtual Reality (abbreviated as VR) mainly uses computer technology to simulate a virtual three-dimensional space, allowing users to freely observe things in the virtual three-dimensional space in real time through visual, auditory and other sensory experiences such that the users feel as if they were in a real situation. However, in the early days, primitive imaging technologies had difficulties showing convincing three-dimensional visual images such that it has been a continuous direction of improvement for VR technology.

The current VR technology integrates advanced technology applications such as computer graphics, computer simulation, artificial intelligence, sensing technology, display technology, and network synchronization processing, which can make the image displays and interactive responses more intuitive and realistic. The use of virtual reality goggles can provide an enclosed visual space, in which, not only a more accurate three-dimensional image simulation can be presented, but also the wearer can turn his/her head, move, and exercise his/her body with simultaneously images following so as to achieve immersive and realistic effects.

However, the existing virtual reality goggles are aiming at improving visual and auditory technologies. Nevertheless, the temperatures of various scene environments should be hot or cold, for example the desert heat, the Arctic coldness, etc., and no visual or auditory experiences can achieve similar experiences for those scene environments; namely, changes in visual effects alone cannot enable the wearer to feel the same as those scene environments should provide to the wearer. Therefore, the purpose of the present invention is to overcome the above problems. In order to make the virtual reality provide better sensory experiences, the applicant has developed a virtual reality fluid flow body sensing device with multi-sensory experiences and in conjunction with virtual reality goggles, whereby vibration and temperature change effects can be generated.

SUMMARY OF THE INVENTION

In order to solve the above problems and achieve the purpose of the present invention, the present invention provides a virtual reality fluid body sensing device in conjunction with a virtual reality goggle to generate multiple sensory experiences such as vibrations and temperature changes. The technical means are implemented as a virtual reality fluid body sensing device, which includes: a body sensing eye mask (1), which, in conjunction with a body portion (101) of a virtual reality goggle (10), is made according to a contour of a face, with an opening (11) for a wearer's eyes to see through being provided in a suitable position in a central portion of the body sensing eye mask (1), and with a fluid channel (12) being provided inside the body sensing a fluid control system (2) connected to the body sensing eye mask (1) to supply a fluid (20) to the body sensing eye mask (1), the fluid control system (2) adjusting a temperature, a flow rate, and a flow speed of the fluid (20) injected into the body sensing eye mask (1);

an outlet pipe (3) with its one end connected to the fluid control system (2) and another end connected to the body sensing eye mask (1), the outlet pipe (3) supplying the fluid (20) output from the fluid control system (2) to the body sensing eye mask (1); and an intake pipe (4) with its one end connected to the body sensing eye mask (1) and another end connected to the fluid control system (2), the intake pipe (4) recovering the fluid (20) discharged from the body sensing eye mask (1) to the fluid control system (2).

More preferably, the body sensing eye mask (1) is made of flexible materials and is provided corresponding to a shape of the body portion (101) of the virtual reality goggle (10) such that after the wearer puts on the body sensing eye mask (1), the wearer's face can fit to the body sensing eye mask (1).

More preferably, a bottom end of the body sensing eye mask (1) further includes an arched nose tip portion (13) which follows the wearer's nose contour.

More preferably, the fluid control system (2) includes a housing (21), a central control unit (22) disposed in the housing (21), a fluid reservoir (23) disposed in the housing (21) for storing the fluid (20) and connected to the outlet pipe (3) and the intake pipe (4), a pump (24) disposed in the housing (21) and electrically connected to the central control unit (22) with one end of the pump (24) connected to the fluid reservoir (23) through the outlet pipe (3) for pumping the fluid (20) out from the fluid reservoir (23), and a temperature control device (25) electrically connected to the central control unit (22) and connected to the pump (24) through the outlet pipe (3) on one end, to control the temperature of the fluid (20).

More preferably, the intake pipe (4) is further provided with at least one valve (5), through whose open and closed states, the intake pipe (4) controls the flow rate of the fluid (20) in the intake pipe (4).

More preferably, one end of the fluid control system (2) is connected with a digital processing device (100), which can open and close the temperature control device (25) through the central control unit (22) to adjust the temperature of the fluid (20) injected into the body sensing eye mask (1), and the digital processing device (100) can also open and close the at least one valve (5) and the pump (24) through the central control unit (22) to control the fluid (20) in the body sensing eye mask (1) regarding the flow velocity of a circulation of the fluid (20) and the flow rate of the fluid (20), and the digital processing device (100) is also connected to the virtual reality goggle (10).

More preferably, the temperature control device (25) is provided with a heating unit (251) and a cooling unit (252) to heat and cool the fluid (20) passing though the control device (25); and the heating unit (251) can utilize a waste heat generated from the digital processing device (100) to heat the fluid (20) passing through the temperature control device (25).

More preferably, the digital processing device (100) can use either wired transmission means or wireless transmission means to connect with the fluid control system (2) and the virtual reality goggle (10).

More preferably, the digital processing device (100) can be chosen from a desktop computer, a notebook computer and a smart phone.

According to the above technical means, the functions that the present invention can achieve are as follows:

The First Point:

By combining the body sensing eye mask (1) with the virtual reality goggles (10) and using the fluid control system (2) to supply cold and hot fluids to the body sensing eye mask (1) to change the temperature of the body sensing eye mask (1), the present invention can achieve the effects of a virtual reality environment, so that the wearers can be immersed in the virtual reality environment and have more realistic sensory experiences.

The Second Point:

The new body sensing eye mask (1) is made of flexible materials, so it is suitable for various face shapes, and the suitability and softness are good, so that no discomfort occurs when the wearer puts on the body sensing eye mask (1), greatly improving the comfort of the body sensing eye mask (1).

The Third Point:

The present invention can transmit a signal to the fluid control system (2) through the digital processing device (100) during an ongoing wearer's body sensing game, such that the opening and closing of the valve body (5) and the operating frequency of the pumping (24) can be driven to make the body sensing eye mask (1) produce a vibration effect to provide the wearer with a more realistic and more instantaneous body sensing effect with higher fidelity.

The Fourth Point:

Since the virtual reality goggle (10) is used in conjunction with the digital processing device (100), the heating unit (251) of the present invention is installed in the temperature control device (25) and is used to receive the waste heat generated by the heat dissipation system of the digital processing device (100), whereby the fluid (20) passing through the temperature control device (25) is heated, thereby recovering the heat and using the recovered heat to achieve the purpose of energy saving.

Other objectives, advantages and novel features of the invention will become more apparent from the following detailed description when taken in conjunction with the accompanying drawings.

DETAILED DESCRIPTION OF THE INVENTION

Figure 1:
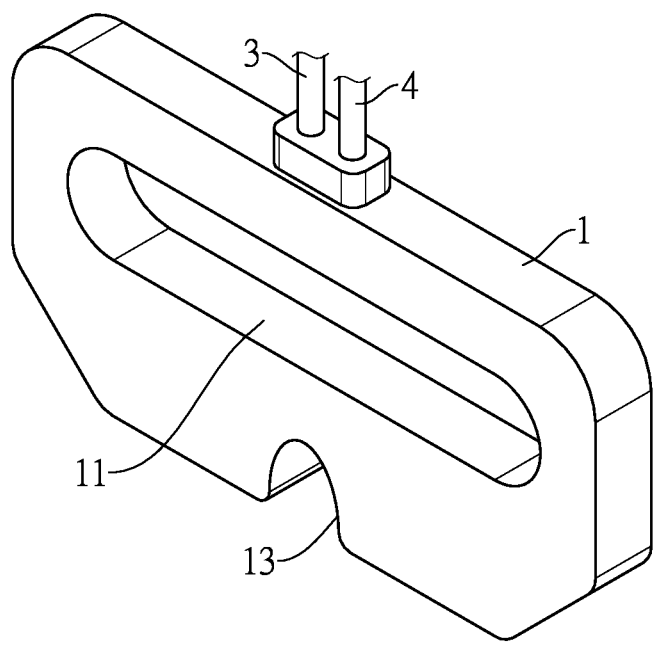
FIG. 1 is a 3D schematic diagram of the body sensing eye mask of the present invention.
Figure 2:
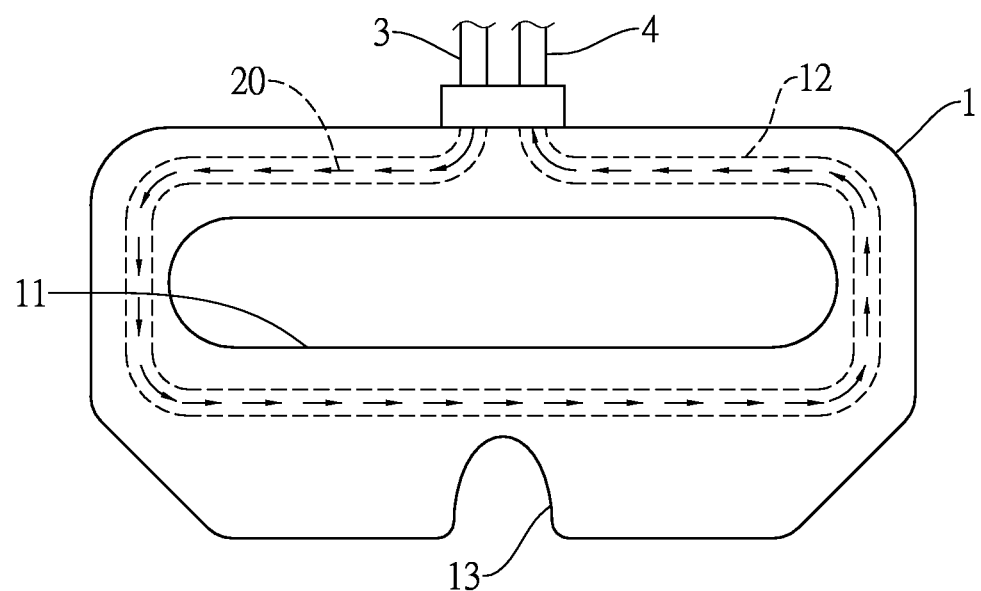
FIG. 2 is a schematic plan view of the body sensing eye mask of the present invention.
Figure 3:
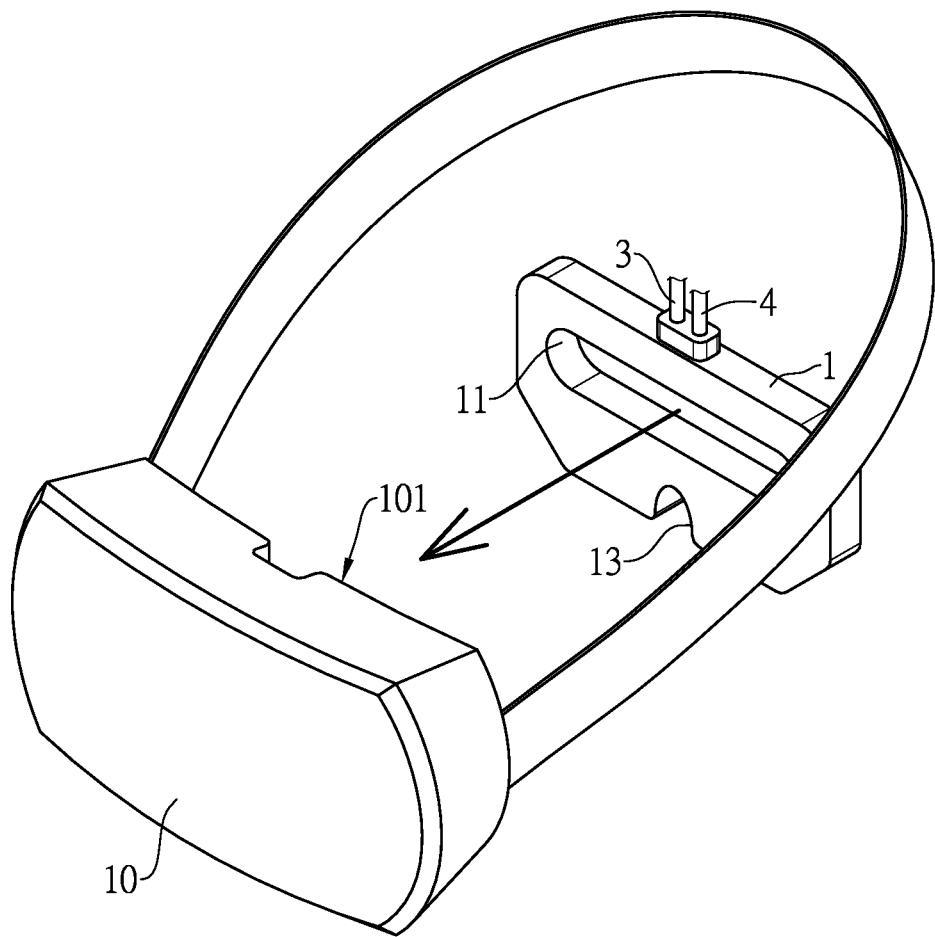
FIG. 3 is a schematic diagram of the combination of the body sensing eye mask and the virtual reality goggle of the present invention.

As shown in FIGS. 1 to 4, a virtual reality fluid body sensing device includes a body sensing eye mask (1), a fluid control system (2), an outlet pipe (3) and an intake pipe (4). The details of these structures are as follows.

The body sensing eye mask (1), which, in conjunction with a body portion (101) of a virtual reality goggle (10), is made according to a contour of a face, and is provided with an opening (11) in a suitable position in a central portion of the body sensing eye mask (1) for the wearer's eyes to see through, and is provided with a fluid channel (12) inside the body sensing eye mask (1).

The fluid control system (2) connected to the body sensing eye mask (1) is to supply a fluid (20) to the body sensing eye mask (1), and is to adjust the temperature, flow rate, and flow speed of the fluid (20) injected into the body sensing eye mask (1).

The outlet pipe (3), with its one end connected to the fluid control system (2) and another end connected to the body sensing eye mask (1), can supply the fluid (20) output from the fluid control system (2) to the body sensing eye mask (1).

The intake pipe (4), with its one end connected to the body sensing eye mask (1) and the other end connected to the fluid control system (2), can recover the fluid (20) discharged from the body sensing eye mask (1) to the fluid control system (2).

A bottom end of the body sensing eye mask (1) further has an arched nose tip portion (13) which follows the wearer's nose contour to accommodate the wear's nose to prevent the wearer from being pressured on the nose due to prolonged wearing of the body sensing eye mask (1), thereby enhancing the wearer's comfort in using the virtual reality goggle (10).

Figure 4:
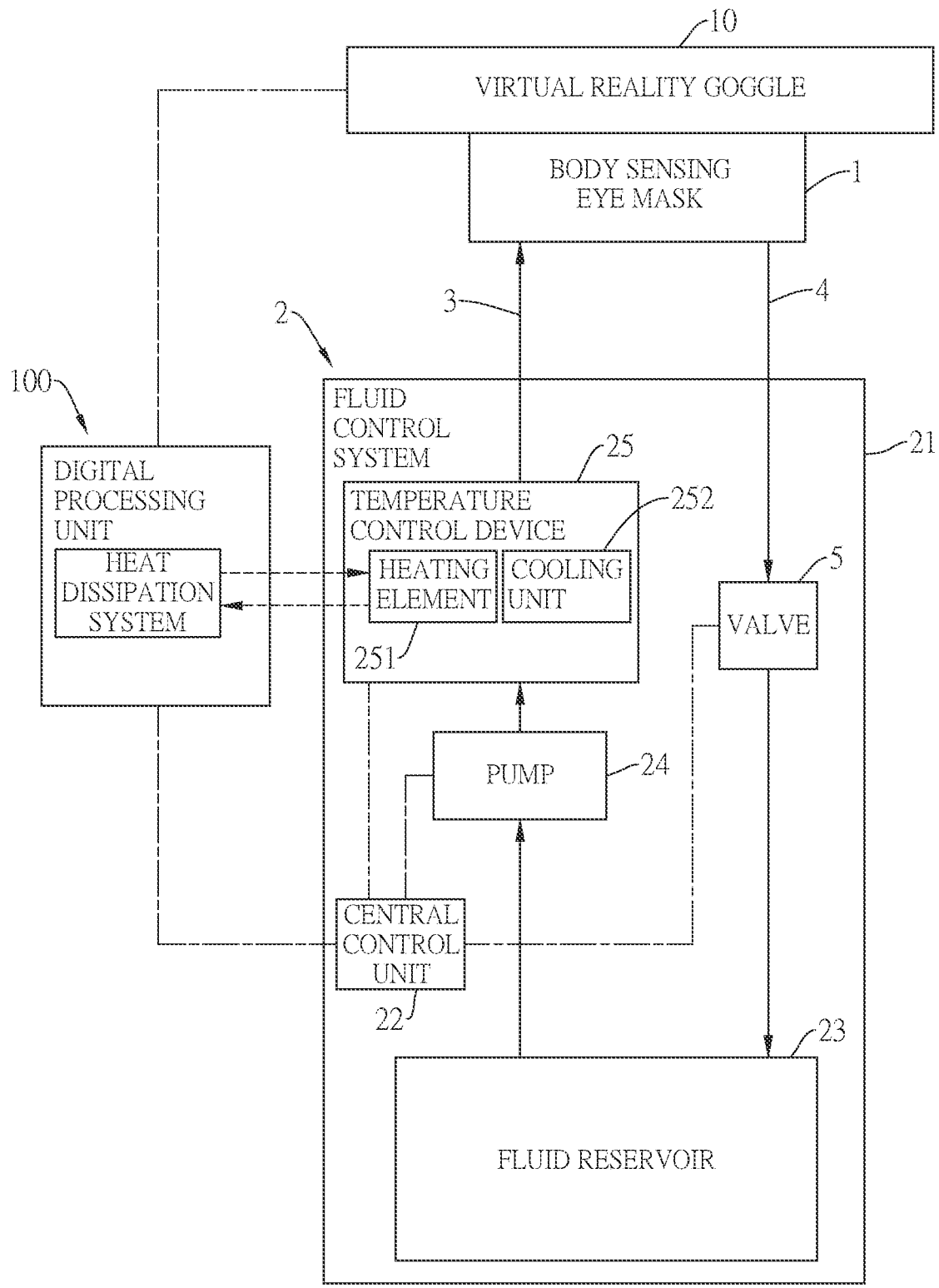
FIG. 4 is a functional block diagram of the present invention.

Please also refer to FIG. 4. The fluid control system (2) includes a housing (21), a central control unit (22) disposed in the housing (21), a fluid reservoir (23) disposed in the housing (21) for storing the fluid (20) and connected to the outlet pipe (3) and the intake pipe (4), a pump (24) disposed in the housing (21) and electrically connected to the central control unit (22) with one end of the pump (24) connected to the fluid reservoir (23) through the outlet pipe (3) for pumping the fluid (20) out from the fluid reservoir (23), a temperature control device (25) electrically connected to the central control unit (22) and connected to the pump (24) through the outlet pipe (3) on one end, and the intake pipe (4) shown in FIG. 4, further provided with at least one valve (5), through whose open and closed states controls the flow rate of the fluid (20) in the intake pipe (4), and the temperature control device (25) shown in FIG. 4, further provided with a heating unit (251) and a cooling unit (252), thereby heating and cooling the fluid (20) passing though the temperature control device (25).

It should be emphasized here that one end of the fluid control system (2) is connected with a digital processing device (100), which can open and close the temperature control device (25) through the central control unit (22), to adjust the temperature of the fluid injected into the body sensing eye mask (1), and also can open and close the at least one valve (5) and the pump (24) through the central control unit (22) to control the fluid (20) in the body sensing eye mask (1) regarding the flow velocity of the circulation of the fluid (20) and the flow rate of the fluid (20), the digital processing device (100) is also connected to the virtual reality goggle (10), and the digital processing device (100) can be a desktop computer or a notebook computer or a smart phone to transmit a signal to the fluid control system (2). The digital processing device (100) can also provide different transmission means according to different hardware requirements. The transmission means can be wired or wireless transmission and other transmission means to facilitate applications and to effectively expand the scope of applications of the present invention.

It can be known from the aforementioned that the present invention can be applied to a wearer's body sensing game when the scene environment changes (such as rain, snow, hot and other different scene environments), wherein the digital processing device (100) transmits a signal to the central control unit (22) of the fluid control system (2) to make the central control unit (22) drive the pump (24), the temperature control device (25), and the at least one valve (5) to supply cold or hot fluid (20) to the body sensing eye mask (1) to make the body sensing eye mask (1) change in temperature to achieve the effect of a virtual environment, so that the wearer can be immersed in a virtual environment to have more realistic sensory experiences.

On the other hand, since the virtual reality goggle (10) is used in conjunction with the digital processing device (100), the heating unit (251) in the temperature control device (25) can be used to receive waste heat generated from the digital processing device (100), therewith to heat the fluid (20) passing through the temperature control device (25), thereby achieving the purpose of saving energy.

Figure 5:
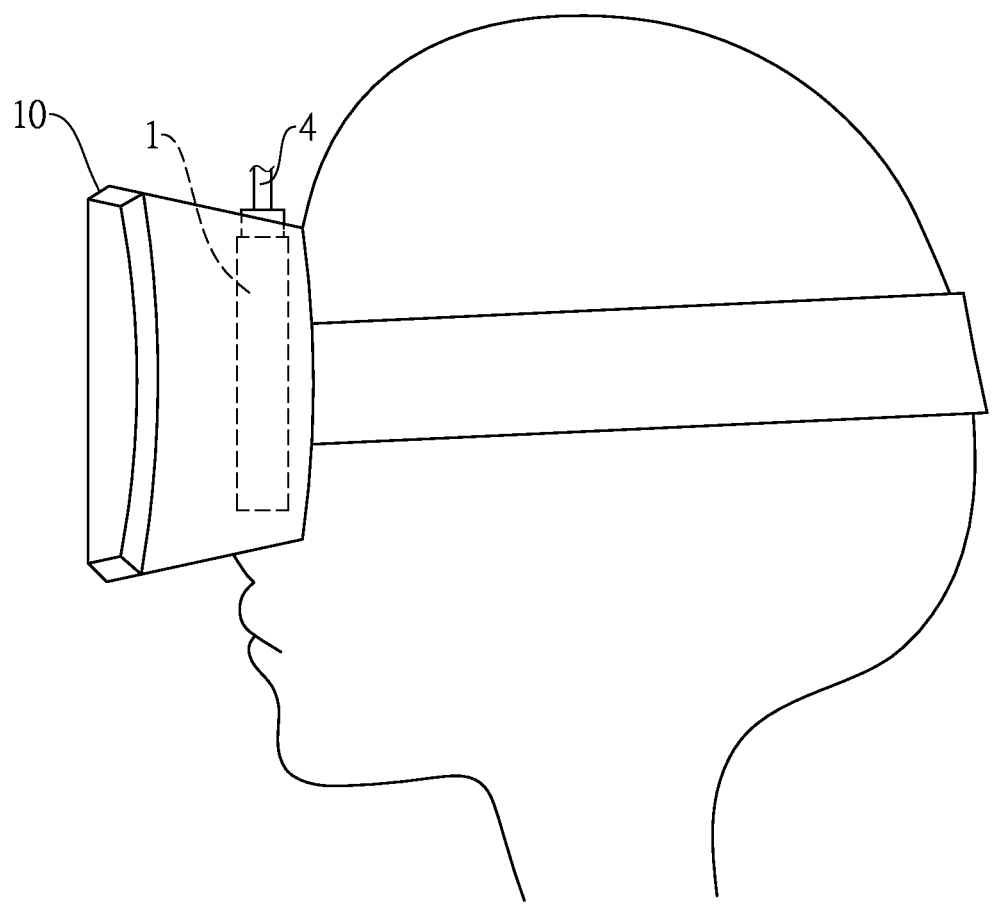
FIG. 5 is an operational view of the present invention.

As shown in FIG. 5, the body sensing eye mask (1) is made of flexible materials and is provided corresponding to the shape of the body portion (101) of the virtual reality goggle (10) such that after the wearer puts on the body sensing eye mask (1), the user's face can fit to the body sensing eye mask (1); as a result, the body sensing eye mask (1) can be applied to various face shapes with good suitability and softness, so that the wearer will not feel uncomfortable when wearing the body sensing eye mask (1); thus the comfort of the body sensing eye mask (1) is greatly enhanced.

Figure 6:
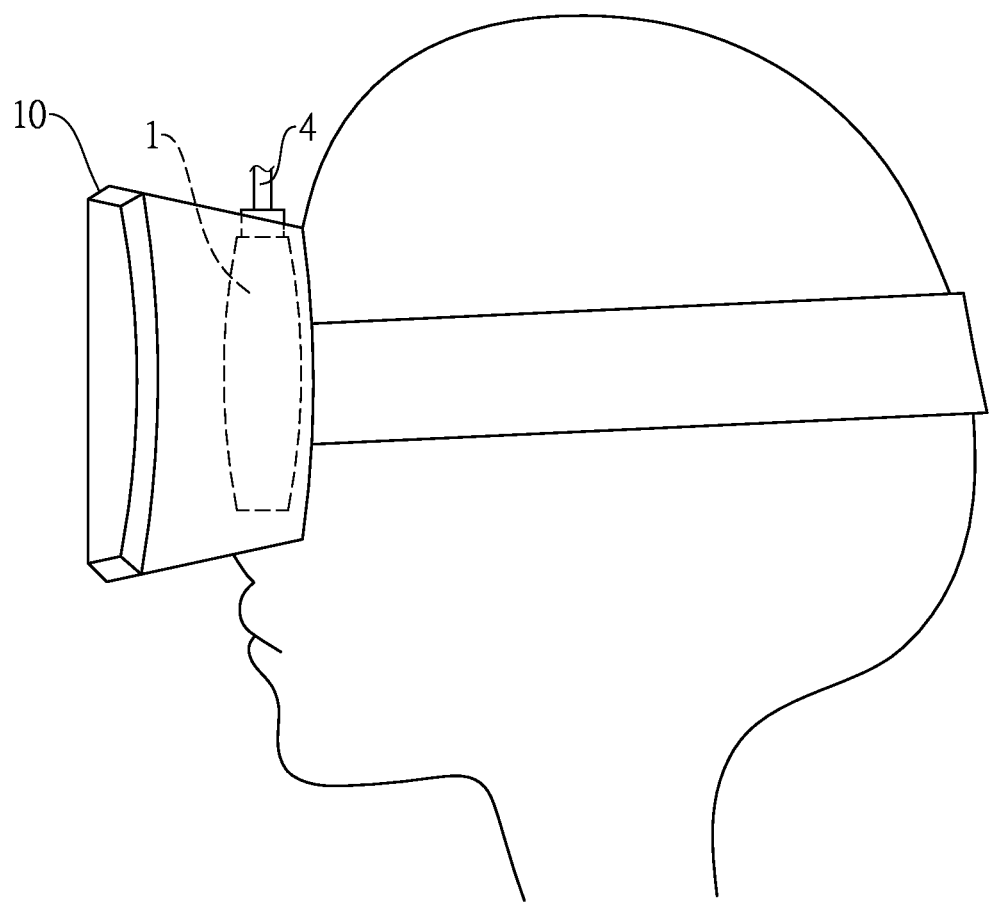
FIG. 6 is an operational view showing the expansion effect of the body sensing eye mask of the present invention.
Figure 7:
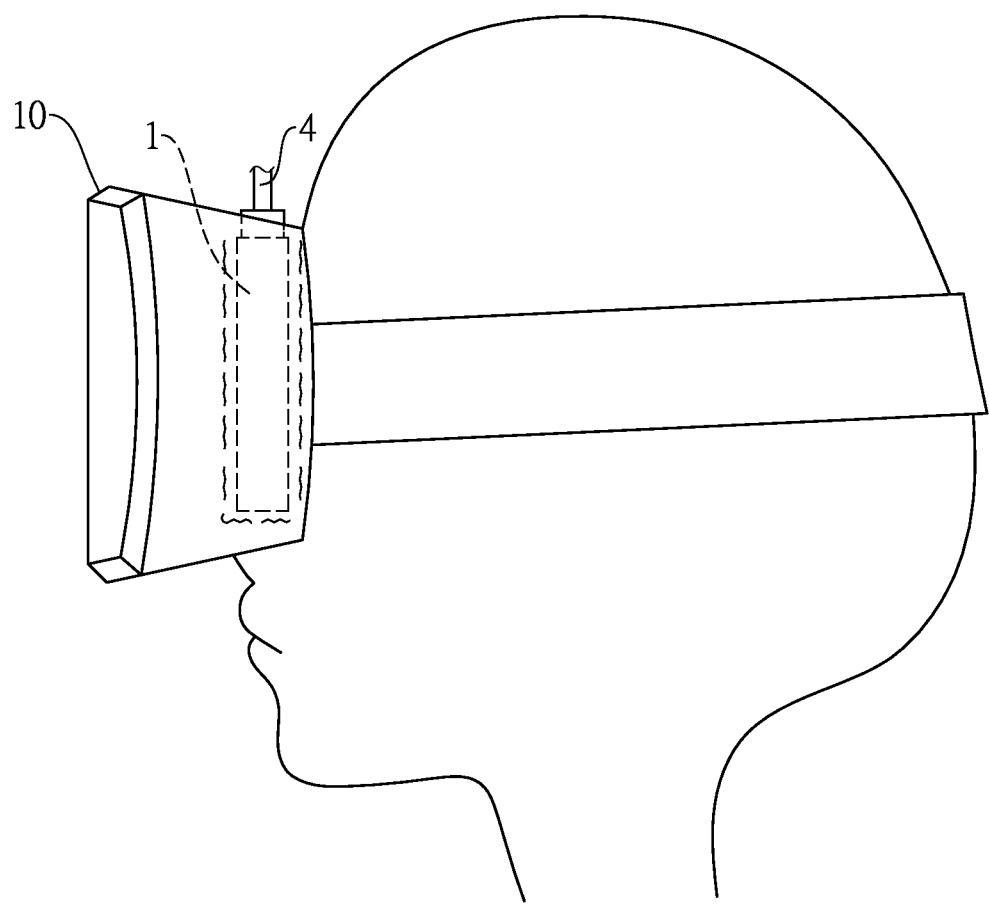
FIG. 7 is an operational view showing the vibration effect of the body sensing eye mask of the present invention.

As shown in FIG. 6 and FIG. 7, the central control unit (22) can control the opening and closing of the at least one valve (5) and the operating frequency of the pump (24), so that the body sensing eye mask (1) generates vibrations and expansions to provide the wearer with a more realistic and more instantaneous body sensing effect with higher fidelity.

Even though numerous characteristics and advantages of the present invention have been set forth in the foregoing description, together with details of the structure and function of the invention, the disclosure is illustrative only. Changes may be made in detail, especially in matters of shape, size, and arrangement of parts within the principles of the invention to the full extent indicated by the broad general meaning of the terms in which the appended claims are expressed.

What is claimed is:

1. A virtual reality fluid body sensing device, including:
   a body sensing eye mask (1), which, in conjunction with a body portion (101) of a virtual reality goggle (10), is made according to a contour of a face, with an opening (11) for a wearer's eyes to see through and being provided in a suitable position in a central portion of the body sensing eye mask (1), and with a fluid channel (12) being provided inside the body sensing eye mask (1);
   a fluid control system (2) connected to the body sensing eye mask (1) to supply a fluid (20) to the body sensing eye mask (1), the fluid control system (2) adjusting a temperature, a flow rate, and a flow speed of the fluid (20) injected into the body sensing eye mask (1);
   an outlet pipe (3) with one end connected to the fluid control system (2) and another end connected to the body sensing eye mask (1), the outlet pipe (3) supplying the fluid (20) output from the fluid control system (2) to the body sensing eye mask (1); and
   an intake pipe (4) with one end connected to the body sensing eye mask (1) and another end connected to the fluid control system (2), the intake pipe (4) recovering the fluid (20) discharged from the body sensing eye mask (1) to the fluid control system (2).

2. The virtual reality fluid body sensing device as claimed in claim 1, wherein
   the body sensing eye mask (1) is made of flexible materials and is provided corresponding to a shape of the body portion (101) of the virtual reality goggle (10) such that after the wearer puts on the body sensing eye mask (1), the wearer's face fits to the body sensing eye mask (1).

3. The virtual reality fluid body sensing device as claimed in claim 1, wherein
   a bottom end of the body sensing eye mask (1) further includes an arched nose tip portion (13) which follows the wearer's nose contour.

4. The virtual reality fluid body sensing device as claimed in claim 1, wherein
   the fluid control system (2) includes
   a housing (21);
   a central control unit (22) disposed in the housing (21);
   a fluid reservoir (23) disposed in the housing (21) for storing the fluid (20) and connected to the outlet pipe (3) and the intake pipe (4);
   a pump (24) disposed in the housing (21) and electrically connected to the central control unit (22) with one end of the pump (24) connected to the fluid reservoir (23) through the outlet pipe (3) for pumping the fluid (20) out from the fluid reservoir (23); and
   a temperature control device (25) electrically connected to the central control unit (22) and connected to the pump (24) through the outlet pipe (3) on one end of the temperature control device (25) to control the temperature of the fluid (20).

5. The virtual reality fluid body sensing device as claimed in claim 4, wherein
   the intake pipe (4) is further provided with at least one valve (5), through open and closed states of the at least one valve (5), the intake pipe (4) controls the flow rate of the fluid (20) in the intake pipe (4).

6. The virtual reality fluid body sensing device as claimed in claim 5, wherein
   one end of the fluid control system (2) is connected with a digital processing device (100), which opens and closes the temperature control device (25) through the central control unit (22) to adjust the temperature of the fluid injected into the body sensing eye mask (1), and the digital processing device (100) also opens and closes the at least one valve (5) and the pump (24) through the central control unit (22) to control the fluid (20) in the body sensing eye mask (1) regarding the flow velocity of a circulation of the fluid (20) and the flow rate of the fluid (20), and the digital processing device (100) is also connected to the virtual reality goggle (10).

7. The virtual reality fluid body sensing device as claimed in claim 6, wherein
   the temperature control device (25) is provided with a heating unit (251) and a cooling unit (252) to heat and cool the fluid (20) passing though the temperature control device (25); and the heating unit (251) utilizes a waste heat generated from the digital processing device (100) to heat the fluid (20) passing through the temperature control device (25).

8. The virtual reality fluid body sensing device as claimed in claim 6, wherein the digital processing device (100) uses either wired transmission means or wireless transmission means to connect with the fluid control system (2) and the virtual reality goggle (10).

9. The virtual reality fluid body sensing device as claimed in claim 6, wherein the digital processing device (100) is a desktop computer, a notebook computer or a smart phone.

\* \* \* \* \*